United States Patent
Liu et al.

(10) Patent No.: US 10,002,847 B2
(45) Date of Patent: Jun. 19, 2018

(54) OLED PIXEL UNIT, TRANSPARENT DISPLAY DEVICE, METHOD FOR FABRICATING THE SAME, DISPLAY APPARATUS

(71) Applicant: BOE TECHNOLOGY GROUP CO., LTD., Beijing (CN)

(72) Inventors: Libin Liu, Beijing (CN); Deming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/126,564

(22) PCT Filed: Sep. 22, 2015

(86) PCT No.: PCT/CN2015/090238
§ 371 (c)(1),
(2) Date: Sep. 15, 2016

(87) PCT Pub. No.: WO2016/179940
PCT Pub. Date: Nov. 17, 2016

(65) Prior Publication Data
US 2017/0084572 A1   Mar. 23, 2017

(30) Foreign Application Priority Data
May 12, 2015 (CN) .......................... 2015 1 0238191

(51) Int. Cl.
*H01L 25/04* (2014.01)
*H01L 27/32* (2006.01)
(Continued)

(52) U.S. Cl.
CPC ............ *H01L 25/048* (2013.01); *H01L 27/32* (2013.01); *H01L 27/3246* (2013.01);
(Continued)

(58) Field of Classification Search
CPC ............ H01L 51/5237; H01L 51/0023; H01L 51/5203; H01L 51/56; H01L 25/048;
(Continued)

(56) References Cited

U.S. PATENT DOCUMENTS

2011/0127499 A1   6/2011   Yoon et al.
2011/0241000 A1   10/2011  Choi et al.
(Continued)

FOREIGN PATENT DOCUMENTS

CN   103219355 A   7/2013
CN   103500752 A   1/2014
(Continued)

OTHER PUBLICATIONS

Office Action in Chinese Application No. 201510238191.X dated Apr. 19, 2017, with English translation.
(Continued)

*Primary Examiner* — Caridad Everhart
(74) *Attorney, Agent, or Firm* — Womble Bond Dickinson (US) LLP

(57) ABSTRACT

An OLED pixel unit is disclosed, which comprises an opaque region and a transparent region which are arranged side by side, the opaque region comprises an opaque display element, and the transparent region comprises at least one transparent display element. Independent operation of the opaque display element and the transparent display element is realized without affecting the transparent display in the transparent region of the OLED pixel unit, thus increasing the resolution of the OLED pixel unit. A transparent display device comprising the OLED pixel unit, a method for fabricating a transparent display device, and a display apparatus are further disclosed.

17 Claims, 3 Drawing Sheets

(51) Int. Cl.
H01L 51/56 (2006.01)
H01L 51/52 (2006.01)
H01L 51/00 (2006.01)

(52) U.S. Cl.
CPC ...... H01L 27/3267 (2013.01); H01L 27/3276 (2013.01); H01L 27/3283 (2013.01); H01L 27/3286 (2013.01); H01L 27/3288 (2013.01); H01L 51/0023 (2013.01); H01L 51/5203 (2013.01); H01L 51/5237 (2013.01); H01L 51/5284 (2013.01); H01L 51/56 (2013.01)

(58) Field of Classification Search
CPC ............. H01L 27/3283; H01L 27/3267; H01L 27/3276; H01L 27/3246; H01L 27/3288; H01L 51/5287
See application file for complete search history.

(56) References Cited

U.S. PATENT DOCUMENTS

| | | |
|---|---|---|
| 2012/0153321 A1 | 6/2012 | Chung et al. |
| 2013/0187131 A1* | 7/2013 | Chung .................. H01L 27/326 257/40 |
| 2013/0328024 A1 | 12/2013 | Mizusaki et al. |
| 2014/0186978 A1 | 7/2014 | Kang et al. |
| 2015/0053964 A1 | 2/2015 | Fujimura et al. |
| 2016/0093250 A1* | 3/2016 | Lee ..................... H01L 27/3218 345/77 |
| 2017/0010734 A1 | 1/2017 | Liu et al. |

FOREIGN PATENT DOCUMENTS

| | | |
|---|---|---|
| CN | 203480166 U | 3/2014 |
| CN | 104393021 A | 3/2015 |
| CN | 104795434 A | 7/2015 |

OTHER PUBLICATIONS

International Search Report and Written Opinion in PCT/CN2015/090238 dated Feb. 3, 2016, with English translation. 16 pages.
"Second office action," CN Application No. 201510238191.X (dated Dec. 14, 2017).

* cited by examiner

OLED PIXEL UNIT, TRANSPARENT DISPLAY DEVICE, METHOD FOR FABRICATING THE SAME, DISPLAY APPARATUS

RELATED APPLICATIONS

The present application claims the benefit of Chinese Patent Application No. 201510238191.X, filed on May 12, 2015, the entire disclosure of which is incorporated herein by reference.

TECHNICAL FIELD

The present invention relates to the field of display technology, and particularly to an OLED (organic light emitting diode) pixel unit, a transparent display device, a method for fabricating the same, and a display apparatus.

BACKGROUND

As a brand new display technique, a transparent display enables a viewer to see a background behind the screen. Such a novel display effect expands the application fields of display, and can be applied to a display device such as a mobile phone, a notebook computer, a show window, a refrigerator door, a vehicle display, and a billboard.

FIG. 1 schematically illustrates an existing transparent OLED display device (hereinafter referred to as a transparent display device). The transparent display device 10 comprises a plurality of OLED pixel units 100 defined by gate lines 150 and data lines 160. Each OLED pixel unit 100 comprises an opaque region 110 and a transparent region 120. The opaque region 110 generally comprises a display device 111. The display device 111 is energized by means of a data line (not shown) to emit light for illuminating the transparent region 120, sot that the function of the transparent display. The transparent region 120 is not provided with any pixel structure, and is primarily used for transmitting the light emitted by the display device 111.

SUMMARY

There is a room for improvement in the existing transparent display device. Embodiments of the present invention intend to improve the existing transparent display device.

In a first aspect of the present invention, it is provided an OLED pixel unit. The OLED pixel unit comprises an opaque region and a transparent region which are arranged side by side, the opaque region comprises an opaque display element, wherein the transparent region comprises at least one transparent display element. According to the embodiment, since the transparent display element is transparent when it does not operate, a normal operation of the opaque display element is not affected. Namely, when the transparent display element operates, the OLED pixel unit in the transparent region can still realize a transparent display. Therefore, according to the embodiment, the transparent region of the OLED pixel unit is made full use, and the resolution of the OLED pixel unit is increased.

In the OLED pixel unit in an embodiment of the present invention, a cathode of the opaque display element and a cathode of the transparent display element can be made from a same material layer simultaneously and are disconnected from each other. According to the embodiment, since the opaque display element and the transparent display element comprise isolated cathodes, the opaque display element and the transparent display element can be independently controlled.

In the OLED pixel unit in an embodiment of the present invention, at least one insulating layer in a multilayer structure below the cathode of the opaque display element and the cathode of the transparent display element can have a height difference between the opaque region and the transparent region. According to the embodiment, since the multilayer structure below the cathodes has a height difference between the opaque region and the transparent region, the cathode of the opaque display element and the cathode of the transparent display element which are formed over the multilayer structure can be disconnected from, i.e., isolated from each other.

In the OLED pixel unit in an embodiment of the present invention, the multilayer structure may comprise a passivation layer which is arranged below an anode of the opaque display element and an anode of the transparent display element, and the passivation layer has a larger thickness in the opaque region than that in the transparent region. According to the embodiment, since there is a height difference in the passivation layer between the opaque region and the transparent region, the cathode of the opaque display element and the cathode of the transparent display element to be formed can be disconnected from each other, i.e., isolated from each other.

In the OLED pixel unit in an embodiment of the present invention, a spacer can be arranged below the cathode of the opaque display element. According to the embodiment, since the spacer is arranged below the cathode of the opaque display element, while no spacer is arranged below the cathode of the transparent display element, so that the cathode of the opaque display element and the cathode of the transparent display element to be formed can be disconnected from each other, i.e., isolated from each other.

In the OLED pixel unit in an embodiment of the present invention, the anode of the opaque display element and the anode of the transparent display element can be arranged in a same layer. According to the embodiment, since the anode of the opaque display element and the anode of the transparent display element are arranged in a same layer, anodes of the transparent display element can be formed in such a manner that the fabricating process of opaque display element is not affected.

In the OLED pixel unit in an embodiment of the present invention, the anode of the opaque display element can be a stack of a first transparent electrode layer, a reflective electrode layer and a second transparent electrode layer, and the anode of the transparent display element can be made from the first transparent electrode layer. According to the embodiment, when the opaque display element operates independently, it emits from a single side (top emitting) and realizes the function of transparent display, and when the transparent display element operates independently, it realizes the function of double side display.

In the OLED pixel unit in an embodiment of the present invention, the first transparent electrode layer can be made from polycrystalline transparent electrically conductive oxides, the reflective electrode layer can be made from a reflective metal, and the second transparent electrode layer can be made from amorphous transparent electrically conductive oxides. For example, the transparent electrically conductive oxides can be ITO (indium tin oxide), IZO (indium zinc oxide), IGZO (indium gallium zinc oxide), InGaSnO (indium gallium tin oxide), or the like. In an exemplary embodiment, the transparent electrically conductive oxide is ITO. For example, the reflective metal can be Ag, Mg/Ag alloy or the like. According to the embodiment, by utilizing different tolerance against an etching solution for transparent electrically conductive oxides in different states, the anode of the transparent display element can be formed when the anode of the opaque display element is formed, thus simplifying the fabricating process for the anodes.

In the OLED pixel unit in an embodiment of the present invention, the opaque display element can be an AMOLED (active matrix OLED) display element, and the transparent display element can be PMOLED (passive matrix OLED) display element. According to the embodiment, the common opaque display element and transparent display element are used realize technical solutions of the present invention. The PMOLED display element has advantages of simple structure, simple driving manner and low cost, and thus is used herein as the transparent display element.

In the OLED pixel unit in an embodiment of the present invention, the opaque region may comprise one opaque display element, and the transparent region may comprise one transparent display element. According to the embodiment, each OLED pixel unit only comprises one opaque display element and one transparent display element. For example, each OLED pixel unit comprises one AMOLED display element and one PMOLED display element.

In a second aspect of the present invention, it is provided a transparent display device. The transparent display device comprises a plurality of OLED pixel units arranged in a matrix, each OLED pixel unit comprises an opaque region and a transparent region which are arranged side by side, the opaque region comprises an opaque display element the transparent region comprises at least one transparent display element. According to the embodiment, since the transparent display element of the transparent display device is transparent when it does not operate, a normal operation of the opaque display element is not affected. Namely, when the transparent display element operates, the OLED pixel unit in the transparent region can still realize a transparent display. Therefore, according to the embodiment, the transparent region of the transparent display device is made full use, and the resolution of the transparent display device is increased.

In the transparent display device in an embodiment of the present invention, a cathode of the opaque display element and a cathode of the transparent display element can be made from a same material layer simultaneously and are disconnected from each other. According to the embodiment, since the opaque display element and the transparent display element comprise isolated cathodes, the opaque display element and the transparent display element can be independently controlled.

In the transparent display device in an embodiment of the present invention, at least one insulating layer in a multilayer structure below the cathode of the opaque display element and the cathode of the transparent display element can have a height difference between the opaque region and the transparent region. According to the embodiment, since the multilayer structure below the cathodes has a height difference between the opaque region and the transparent region, the cathode of the opaque display element and the cathode of the transparent display element which are formed over the multilayer structure can be disconnected from, i.e., isolated from each other.

In the transparent display device in an embodiment of the present invention, the multilayer structure may comprise a passivation layer which is arranged below an anode of the opaque display element and an anode of the transparent display element, and the passivation layer has a larger thickness in the opaque region than that in the transparent region. According to the embodiment, since there is a height difference in the passivation layer between the opaque region and the transparent region, the cathode of the opaque display element and the cathode of the transparent display element to be formed can be disconnected from each other, i.e., isolated from each other.

In the transparent display device in an embodiment of the present invention, a spacer can be arranged below the cathode of the opaque display element. According to the embodiment, since the spacer is arranged below the cathode of the opaque display element, while no spacer is arranged below the cathode of the transparent display element, so that the cathode of the opaque display element and the cathode of the transparent display element to be formed can be disconnected from each other, i.e., isolated from each other.

In the transparent display device in an embodiment of the present invention, the anode of the opaque display element and the anode of the transparent display element can be arranged in a same layer. According to the embodiment, since the anode of the opaque display element and the anode of the transparent display element are arranged in a same layer, anodes of the transparent display element can be formed in such a manner that the fabricating process of opaque display element is not affected.

In the transparent display device in an embodiment of the present invention, the anode of the opaque display element can be a stack of a first transparent electrode layer, a reflective electrode layer and a second transparent electrode layer, and the anode of the transparent display element can be made from the first transparent electrode layer. According to the embodiment, when the opaque display element operates independently, it emits from a single side (top emitting) and realizes the function of transparent display, and when the transparent display element operates independently, it realizes the function of double side display.

In the transparent display device in an embodiment of the present invention, the first transparent electrode layer can be made from polycrystalline ITO, the reflective electrode layer is made from Ag, and the second transparent electrode layer can be made from amorphous ITO. According to the embodiment, by utilizing different tolerance against an etching solution for ITO in different states, the anode of the opaque display element and the anode of the transparent display element are formed successively, thus simplifying the fabricating process for the anodes.

In the transparent display device in an embodiment of the present invention, the opaque display element can be an AMOLED display element, the transparent display element can be a PMOLED display element, and the plurality of OLED pixel units are defined by gate lines and data lines. According to the embodiment, the common opaque display element and transparent display element are used realize technical solutions of the present invention. The PMOLED display element has advantages of simple structure, simple driving manner and low cost, and thus is used herein as the transparent display element.

In the transparent display device in an embodiment of the present invention, the opaque region may comprise one opaque display element, and the transparent region may comprise one transparent display element. According to the embodiment, each OLED pixel unit only comprises one opaque display element and one transparent display element. For example, each OLED pixel unit may comprise one AMOLED display element and one PMOLED display element.

In the transparent display device in an embodiment of the present invention, cathodes of any two neighboring the transparent display elements can be electrically connected with by an electrically connecting element. When the transparent display element operates independently, the anode and cathode of the transparent display element can be connected to a positive pole and negative pole of a driving source respectively, so that the transparent display element is lighted. According to the embodiment, since cathodes of any two neighboring the transparent display elements are interconnected by the electrically connecting element, it is only required for the negative pole of the driving source to be connected to one of the cathodes, but not each cathode, thus simplifying the driver circuit. As used herein, the term "any two neighboring the transparent display elements" comprises several cases. In case each OLED pixel unit only comprises one transparent display element, this term indicates two transparent display elements of any two neighboring OLED pixel units. In case each OLED pixel unit comprises at least two transparent display elements, this term indicates any two neighboring the transparent display elements in each OLED pixel unit, or two transparent display elements of any two neighboring OLED pixel units.

In the transparent display device in an embodiment of the present invention, the electrically connecting element and the anode of the transparent display element can be made from a same material layer simultaneously and are disconnected from each other. According to the embodiment, the electrically connecting element and the anode of the transparent display element are made from a same material layer simultaneously, so that the fabricating process can be simplified.

In a third aspect of the present invention, it is provided a method for fabricating a transparent display device. The transparent display device comprises a plurality of OLED pixel units arranged in a matrix, each OLED pixel unit comprises an opaque region and a transparent region which are arranged side by side, the opaque region comprises an opaque display element, and the transparent region comprises at least one transparent display element. The method comprises: forming an opaque display element on a substrate of the opaque region, and forming at least one transparent display element on a substrate of the transparent region. According to the embodiment, the transparent display element is formed in the transparent region of the transparent display device, and a normal operation of the opaque display element is not affected, so that the transparent region is made full use, and the resolution of the transparent display device is increased.

In the method in an embodiment of the present invention, forming the opaque display element and the transparent display element may comprise: depositing an electrically conductive material on the substrate, forming the anode of the opaque display element and the anode of the transparent display element by a first patterning process, wherein the anode of the transparent display element is transparent; forming a first interlayer dielectric layer covering the anode of the opaque display element and the anode of the transparent display element, and forming a patterned first interlayer dielectric layer by a second patterning process; depositing an organic light emitting material to form an organic light emitting layer of the opaque display element and an organic light emitting layer of the transparent display element; and depositing a transparent electrically conductive material, and forming a cathode of the opaque display element and a cathode of the transparent display element by a third patterning process, wherein the cathode of the opaque display element is disconnected from the cathode of the transparent display element. According to the embodiment, the transparent display element is formed during forming the opaque display element, so that the fabricating process of the transparent display element is compatible with that of the opaque display element, and alternations to the fabricating process of the opaque display element are reduced. In addition, according to the embodiment, since the opaque display element and the transparent display element comprise isolated cathodes, the opaque display element and the transparent display element can be independently controlled.

In the method in an embodiment of the present invention, the first interlayer dielectric layer can at least comprise a pixel defining layer, the pixel defining layer is arranged at a peripheral region of the opaque region and the transparent region for defining a pixel aperture, and the pixel defining layer is provided with a via hole at the peripheral region of the transparent region. According to the embodiment, the pixel defining layer the opaque display element and that of the transparent display element of can be formed simultaneously, thus simplifying the fabricating process.

In the method in an embodiment of the present invention, the opaque display element can be an AMOLED display element, the transparent display element can be a PMOLED display element, and the method further comprises: before forming the anode of the opaque display element and the anode of the transparent display element, forming a thin film transistor of the opaque display element in the opaque region; and depositing a passivation layer on the substrate which covers the thin film transistor, wherein a via hole is formed in the passivation layer through which the source or drain of the thin film transistor is exposed, and the anode of the opaque display element is electrically connected with the source or drain of the thin film transistor through the via hole in the passivation layer. According to the embodiment, the AMOLED display element is formed in the opaque region of the transparent display device.

The method in an embodiment of the present invention may further comprise: after depositing the passivation layer, performing a fourth patterning process on the passivation layers, so that after patterning the passivation layer has a larger thickness in the opaque region than that in the transparent region. According to the embodiment, since there is a height difference in the passivation layer between the opaque region and the transparent region, the cathode of the opaque display element and the cathode of the transparent display element to be formed can be disconnected from each other, i.e., isolated from each other.

The method in an embodiment of the present invention may further comprise: before forming the cathode of the opaque display element, forming a spacer on the patterned first interlayer dielectric layer in the opaque region. According to the embodiment, since the spacer is arranged below the cathode of the opaque display element, while no spacer is arranged below the cathode of the transparent display element, so that the cathode of the opaque display element and the cathode of the transparent display element to be formed can be disconnected from each other, i.e., isolated from each other.

In the method in an embodiment of the present invention, forming the anode of the opaque display element and the anode of the transparent display element may comprise: depositing a stack comprising a first transparent electrode layer, a reflective electrode layer and a second transparent electrode layer; and performing a fifth patterning process on the stack, forming a stack comprising the first transparent electrode layer, the reflective electrode layer and the second transparent electrode layer in the opaque region as the anode of the opaque display element, and only retaining the first transparent electrode layer in the transparent region as the anode of the transparent display element, wherein the anode of the opaque display element is disconnected from the anode of the transparent display element. According to the embodiment, when the opaque display element operates independently, it emits from a single side (top emitting) and realizes the function of transparent display, and when the transparent display element operates independently, it realizes the function of double side display.

In the method in an embodiment of the present invention, forming the anode of the opaque display element and the anode of the transparent display element may comprise: after depositing the stack comprising the first transparent electrode layer, the reflective electrode layer and the second transparent electrode layer, forming a photoresist layer over the stack by using a half tone mask, wherein the photoresist layer in the opaque region has a larger thickness than the photoresist layer in the transparent region; removing the stack between the opaque region and the transparent region by etching; thinning the photoresist layer in the opaque region and removing the photoresist layer in the transparent region by exposure; removing the reflective electrode layer and second transparent electrode layer in the transparent region by etching; and removing the thinned photoresist layer in the opaque region by exposure. According to the embodiment, the anode of the transparent display element can be formed when the anode of the opaque display element is formed, thus simplifying the fabricating process for the anodes.

In the method in an embodiment of the present invention, the first transparent electrode layer can be made from polycrystalline transparent electrically conductive oxides, the reflective electrode layer can be made from a reflective metal, and the second transparent electrode layer can be made from amorphous transparent electrically conductive oxides. For example, the transparent electrically conductive oxides can be ITO (indium tin oxide), IZO (indium zinc oxide), IGZO (indium gallium zinc oxide), InGaSnO (indium gallium tin oxide), or the like. In an exemplary embodiment, the transparent electrically conductive oxide is ITO. For example, the reflective metal can be Ag, Mg/Ag alloy or the like. According to the embodiment, by utilizing different tolerance against an etching solution for transparent electrically conductive oxides in different states, the anode of the transparent display element can be formed when the anode of the opaque display element is formed, thus simplifying the fabricating process for the anodes.

The method in an embodiment of the present invention may further comprise: forming an electrically connecting element so that cathodes of any two neighboring the transparent display elements are electrically connected with each other. According to the embodiment, since cathodes of any two neighboring the transparent display elements are interconnected by the electrically connecting element, it is only required for the negative pole of the driving source to be connected to one of the cathodes, but not each cathode, thus simplifying the driver circuit.

The method in an embodiment of the present invention may further comprise: after depositing the electrically conductive material on the substrate, forming the anode of the transparent display element and the electrically connecting element simultaneously by the first patterning process, wherein the anode of the transparent display element is disconnected from the electrically connecting element, and the electrically connecting element is electrically connected with the cathode of the transparent display element through a via hole in the pixel defining layer. According to the embodiment, the electrically connecting element and the anode of the transparent display element are made from a same material layer simultaneously, so that the fabricating process can be simplified.

In a fourth aspect of the present invention, it is provided a display apparatus, which comprises the OLED pixel unit as described above, or comprises the transparent display device as described above. The display apparatus according to the embodiment has identical or similar technical effects with the OLED pixel unit and/or transparent display device as described above, which are not described in details for simplicity.

BRIEF DESCRIPTION OF THE DRAWINGS

Embodiments of the present invention will be described in detail hereinafter with reference to the drawings, in which.

DETAILED DESCRIPTION OF EMBODIMENTS

Figure 1:
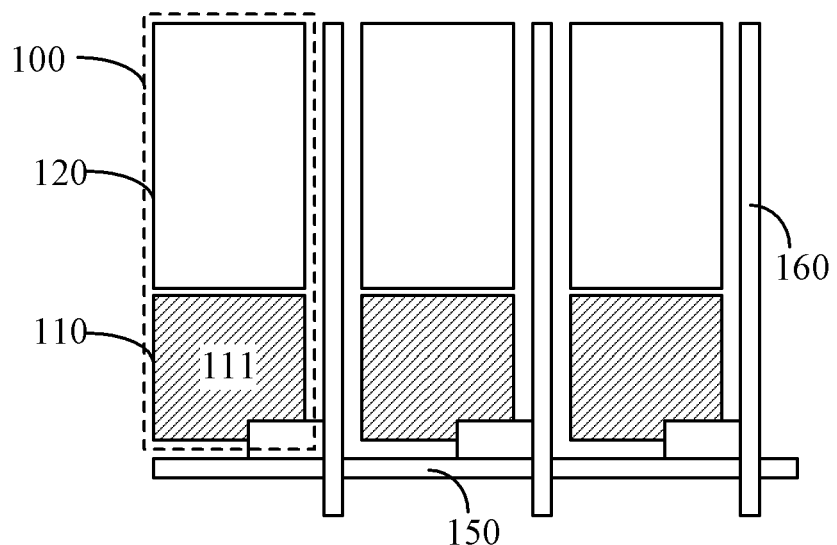
FIG. 1 is a schematic view for an existing transparent display device.

Various modifications to the described aspects may be apparent to a person with ordinary skill in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

In drawings for all embodiments of the present invention, only structures and/or components relevant with the inventive concept are illustrated, while those irrelevant structure and/or component are not illustrated or are partially illustrated.

Reference numerals: 10, 20 transparent display device (prior art; 100, 200 OLED pixel unit; 110, 210 opaque region; 120, 220 transparent region; 111, 211 the opaque display element; 150, 250 gate line; 160, 260 data line; 221 the transparent display element; 241 electrically connecting element; 310 substrate; 320 gate; 322 gate insulating layer; 323 active region; 324 source; 325 drain; 326 passivation layer; 332 pixel defining layer; 334 spacer; 340, 342 anode; 350, 352 organic light emitting layer; 360, 362 cathode; 380 protection layer; 402 first transparent electrode layer; 404 reflective electrode layer; 406 second transparent electrode layer; 412, 412', 422 photoresist layer.

In an existing transparent display device 10 shown in FIG. 1, a display element 111, a driver circuit or the like are generally opaque. In the layout design, these opaque components are integrated in the opaque region 110 in each OLED pixel unit 100 as more as possible, thus increasing transmittance of the OLED pixel unit 100, and realizing a transparent display effect of the OLED display device 10.

On basis of the driving manner, the OLED display elements can be divided into an AMOLED display element and a PMOLED display element. The AMOLED display element adopts an independent thin film transistor to control the display function. The PMOLED display element is simple in structure, is not driven by a transistor, and the display function is realized by directly applying a voltage across the display element. In an embodiment of the present invention, the transparent display element is formed in the transparent region of the transparent display device, and a normal operation of the opaque display element is not affected, so that the transparent region in the existing transparent display device is made full use, and the resolution of the transparent display device is increased.

Figure 2:
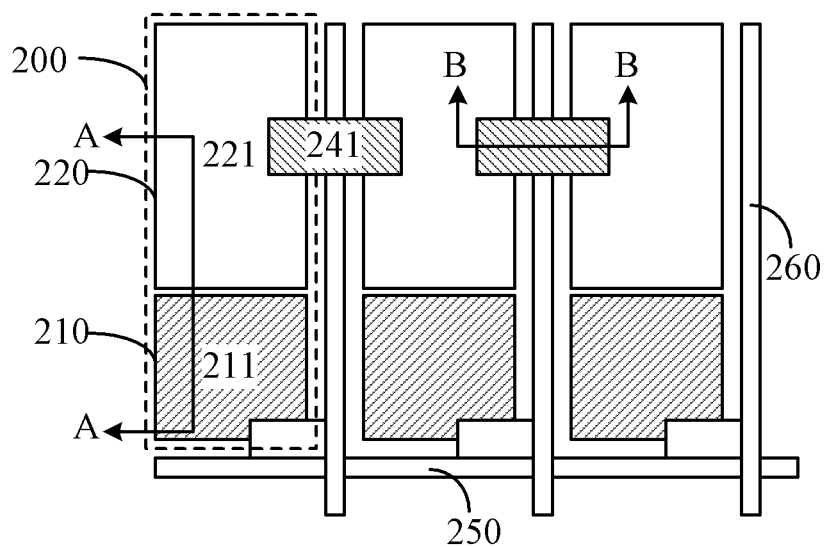
FIG. 2 is a schematic view of a transparent display device in an embodiment of the present invention.

FIG. 2 schematically illustrates a transparent display device 20 in an embodiment of the present invention. As shown, the transparent display device 20 comprises a plurality of OLED pixel units 200 arranged in a matrix. Gate lines 250 and data lines 260 intersect to define OLED pixel units 200. In an exemplary embodiment, each OLED pixel unit 200 comprises an opaque region 210 and a transparent region 220 which are arranged side by side. The opaque region 210 comprises the opaque display element 211, and the transparent region 220 comprises at least one transparent display element 221. According to the present invention, data lines 260 of the opaque display element 211 can be arranged in gaps between neighboring transparent display elements 221, so that the data line can be arranged easily.

In an exemplary embodiment, the opaque display element 211 can be an AMOLED display element, and the transparent display element 221 can be a PMOLED display element. The PMOLED display element has advantages of simple structure, simple driving manner and low cost, and thus is used herein as the transparent display element. Other examples of the opaque display element 211 and the transparent display element 221 will occur to the person with ordinary skill in the art, and the present invention is not limited in this aspect.

In this embodiment, when the AMOLED display element 211 emits light independently, the PMOLED display element 221 is not lighted, but the region in which the PMOLED display element 221 is located still can be a transparent region, so that a transparent display can be realized. When the PMOLED display element 221 emits light independently, additional display can be provided in the transparent region 220. In this way, the AMOLED display element and the PMOLED display element can be independently lighted in the same one transparent display device 20 without affecting the transmittance, and the resolution of the transparent display device can be increased.

Figure 3A:
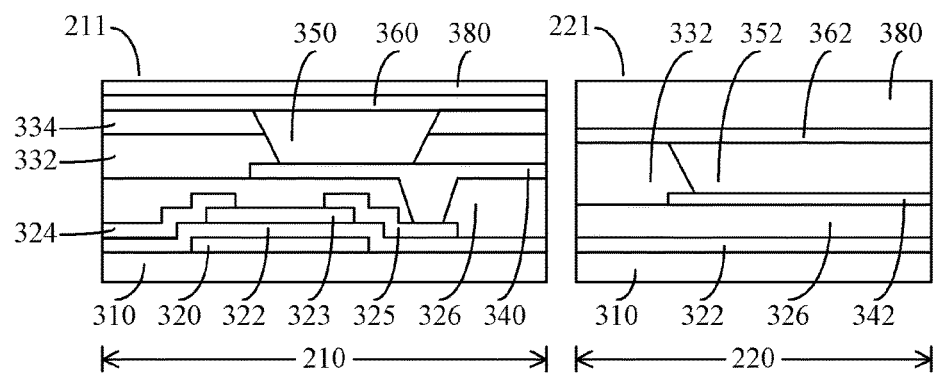
FIG. 3A is a cross-sectional view of a transparent display device along a line A-A in FIG. 2.
Figure 3B:
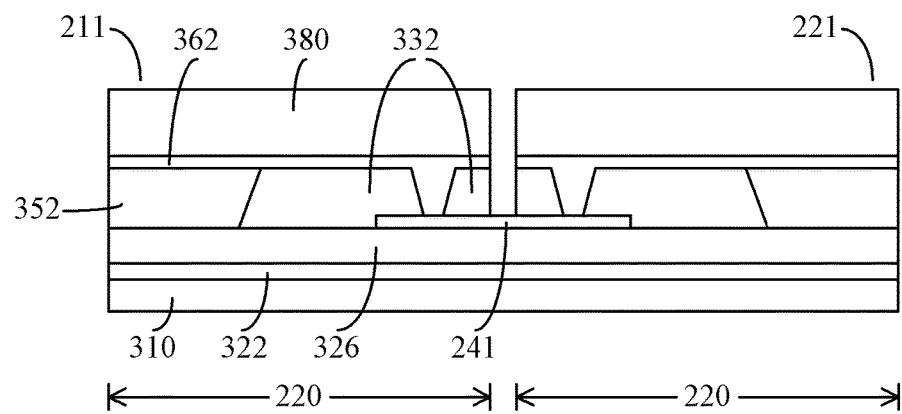
FIG. 3B is a cross-sectional view of a transparent display device along a line B-B in FIG. 2.

FIG. 3A is a cross-sectional view of a transparent display device along a line A-A in FIG. 2, and FIG. 3B is a cross-sectional view of a transparent display device along a line B-B in FIG. 2. As shown, the AMOLED display element 211 and the PMOLED display element 221 are formed on a substrate 310 which is for example made from glass or transparent resin.

As shown in FIG. 3A, the AMOLED display element 211 is arranged in the opaque region 210, and comprises a thin film transistor formed on the substrate 310 and an organic light emitting device driven by the thin film transistor. The thin film transistor comprises: a gate 320 formed on the substrate 310, a gate insulating layer 322 formed on the substrate 310 to cover the gate 320, an active region 323 formed on the gate insulating layer 322, and a source 324 and a drain 325 formed on the active region 323. A passivation layer 326 is formed on the gate insulating layer 322 to cover corresponding portions of the thin film transistor. Optionally, in the opaque region 210, a planarization layer (PLN) layer (not shown) is formed over the passivation layer 326, to provide a flat surface for the organic light emitting device to be formed. The organic light emitting device comprises an anode 340, an organic light emitting layer 350 and a cathode 360. The anode 340 is formed on the passivation layer 326, and is electrically connected with the source 324 or the drain 325 of the thin film transistor through a via hole formed in the passivation layer 326. During operation, the AMOLED display element 211 is driven to emit light via a supply line $V_{dd}$ according to pixel gray level and duration which are input via data lines 260.

As shown in FIG. 3A, the PMOLED display element 221 is arranged in the transparent region 220, and comprises an organic light emitting device formed on the substrate 310. The organic light emitting device comprises an anode 342, an organic light emitting layer 352 and a cathode 362.

In an exemplary embodiment, a pixel defining layer 332 is arranged in the peripheral region of the opaque region 210 and the transparent region 220. The pixel defining layer 332 is patterned by a patterning process to define a pixel aperture of the AMOLED display element 211 and the PMOLED display element 221.

In an exemplary embodiment, the cathode 360 of the AMOLED display element 211 and the cathode 362 of the PMOLED display element 221 can be made from a same material layer simultaneously and are disconnected from each other. In an exemplary embodiment, the cathodes 360, 362 can be made from Mg/Ag alloy, and can have a thickness of about 140 Å. Optionally, the cathodes 360, 362 are formed by evaporation. Since the AMOLED display element 211 and the PMOLED display element 221 have isolated cathodes 360, 362, the AMOLED display element 211 and the PMOLED display element 221 can be independently controlled.

In an exemplary embodiment, at least one insulating layer in the multilayer structure below the cathode 360 of the AMOLED display element 211 and the cathode 362 of the PMOLED display element 221 can have a height difference between the opaque region 210 and the transparent region 220. In particular, as shown in FIG. 3A, the passivation layer 326 below the anodes 340, 342 has a larger thickness in the opaque region 210 than that in the transparent region 220. As a result, the height difference between the opaque region 210 and the transparent region 220 is increased, which facilitates the cathode 360 of the AMOLED display element 211 being isolated from the cathode 362 of the PMOLED display element 221.

In an exemplary embodiment, a spacer 334 can be arranged below the cathode 360 of the AMOLED display element 211, and no spacer is arranged below the cathode 362 of the PMOLED display element 221. Similarly, this can also increase the height difference between the opaque region 210 and the transparent region 220, so that the cathode 360 of the AMOLED display element 211 and the cathode 362 of the PMOLED display element 221 are isolated from each other.

In an exemplary embodiment, the AMOLED display element 211 and the PMOLED display element 221 further comprise a protection layer 380 covering the cathodes 360, 362, and optionally further comprises a planarization layer (not shown) on the protection layer 380.

It will be appreciated by the person with ordinary skill in the art that, the gate insulating layer 322, the passivation layer 326, the planarization layer, the pixel defining layer 332, and the spacer 334 are insulating layers. The insulating layer can be made from silicon oxide, silicon nitride or silicon oxynitride.

In an exemplary embodiment, the anode 340 of the AMOLED display element 211 and the anode 342 of the PMOLED display element 221 can be arranged in a same layer. The passivation layer 326 is provided with a via hole which exposes the source 324 or the drain 325 of the thin film transistor, and the anode 340 of the AMOLED display element 211 is electrically connected with the source 324 or the drain 325 through the via hole. In this embodiment, the anode 342 of the PMOLED display element 221 can be formed during forming the anode 340 of the AMOLED display element 211, thus simplifying the fabricating process of the anode 342.

Figure 4A:
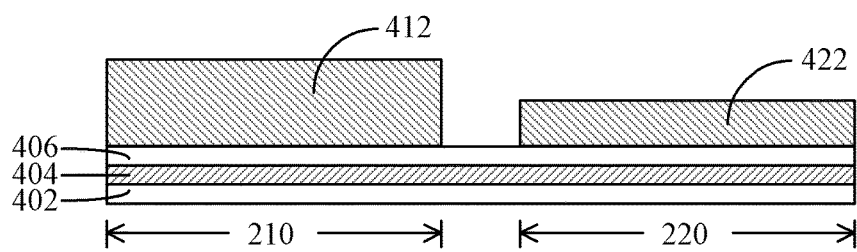
FIGS. 4A, 4B, 4C, 4D and 4E are cross-sectional views of a process for fabricating an anode structure for an opaque display element and a transparent display element in a transparent display device.
Figure 4B:
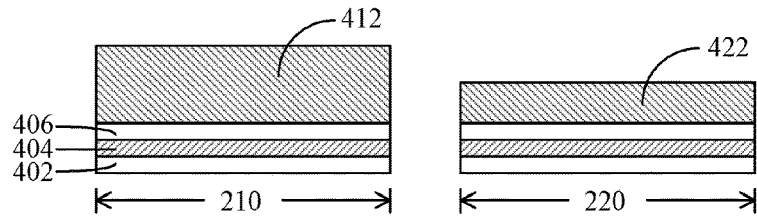
Figure 4C:
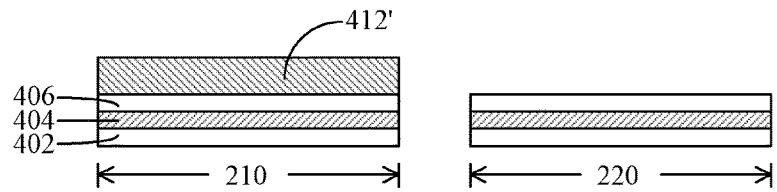
Figure 4D:
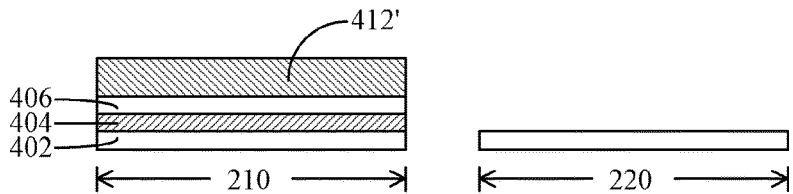
Figure 4E:
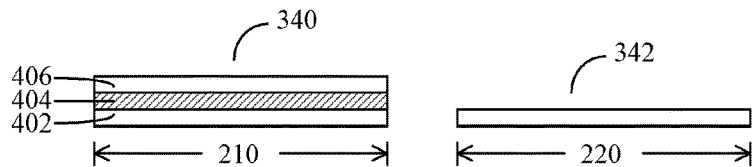

As shown in FIG. 4E, the anode 340 of the AMOLED display element 211 can be a stack of a first transparent electrode layer 402, a reflective electrode layer 404 and a second transparent electrode layer 406, and the anode 342 of the PMOLED display element 221 only comprises the first transparent electrode layer 402. Thereby, when the AMOLED display element 211 operates independently, it emits from a single side (top emitting) and realizes the function of transparent display; while when the PMOLED display element 221 operates independently, it realizes the function of double side display.

In an exemplary embodiment, the first transparent electrode layer 402 can be made from polycrystalline transparent electrically conductive oxides, the reflective electrode layer 404 can be made from a reflective metal, and the second transparent electrode layer 406 can be made from amorphous transparent electrically conductive oxides. For example, the transparent electrically conductive oxides can be ITO (indium tin oxide), IZO (indium zinc oxide), IGZO (indium gallium zinc oxide), InGaSnO (indium gallium tin oxide), or the like. For example, the reflective metal can be Ag or Mg/Ag alloy. For example, the reflective electrode layer 404 can be an Ag layer, and have a thickness of about 1000 Å. For example, the first transparent electrode layer 402 and the second transparent electrode layer 406 can be an ITO layer, and have a thickness of about 80 Å. According to the embodiment, by utilizing different tolerance against an etching solution for transparent electrically conductive oxides in different states, the anode 342 of the transparent display element 221 can be formed during forming the anode 340 of the opaque display element 211, thus simplifying the fabricating process of the anode 342.

As shown in FIG. 2 and FIG. 3B, an electrically connecting element 241 connects the cathodes 362 of any two neighboring PMOLED display elements 221. The electrically connecting element 241 is made from an electrically conductive material. In an exemplary embodiment, the electrically connecting element 241 can be formed simultaneously from a same material layer as the anode 342 of the PMOLED display element 221, and disconnected from each other. When the PMOLED display element 221 operates independently, the anode 342 and the cathode 362 can be connected to a positive pole and a negative pole of the driving source respectively, so that the PMOLED display element 221 is lighted. Since the cathodes 362 of any two neighboring PMOLED display elements 221 are connected via the electrically connecting element 241, it is only required for the negative pole of the driving source to be connected to one of the cathodes, instead of both cathode 362, thus simplifying the driver circuit. In addition, the electrically connecting element 241 and the anode 342 can be made from a same material layer simultaneously, thus simplifying the fabricating process.

In exemplary embodiments as described above, the cathodes 362 of any two neighboring PMOLED display elements 221 are electrically connected via the electrically connecting element 241. However, the present invention is not limited in this aspect. For example, the cathode 362 of each PMOLED display element 221 can be made from a continuous electrically conductive film. According to the concept of the present invention, Cathodes of the AMOLED display element and the PMOLED display element can be isolated from each other to realize independent driving of the AMOLED display element and the PMOLED display element. Namely, the cathode of the PMOLED display element can be realized in other manner than those of the above described embodiments.

Figure 5:
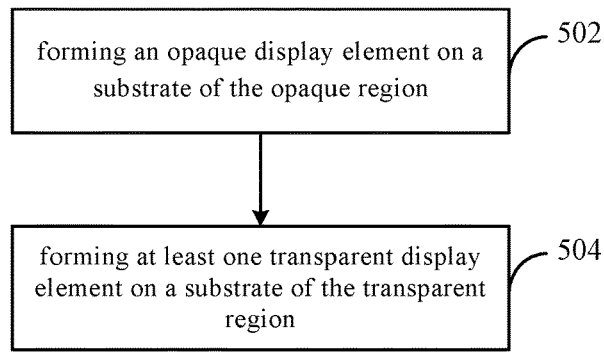
FIG. 5 is a flow chart of a method for fabricating a transparent display device in an embodiment of the present invention.

Reference is made to FIGS. 3A-3B, FIGS. 4A-4E, and FIG. 5 to describe a method for fabricating a transparent display device in an embodiment of the present invention. Cross-sectional views in FIGS. 4A, 4B, 4C, 4D and 4E schematically illustrate the process for fabricating the anode for the opaque display element and the transparent display element in the transparent display device in an embodiment of the present invention. FIG. 5 schematically illustrates a flow chart of a method for fabricating a transparent display device in an embodiment of the present invention.

As shown in FIG. 5, in an exemplary embodiment, a method for fabricating a transparent display device comprises: step 502, forming the opaque display element on the substrate in the opaque region, and step 504, forming at least one transparent display element on the substrate in the transparent region.

In the following, description is made in an exemplary way in which the opaque display element is an AMOLED display element and the transparent display element is a PMOLED display element, for purpose of describing a method for fabricating a transparent display device in the present invention. Generally, the step 502 may comprise: forming a thin film transistor on the substrate in the opaque region, and forming an organic light emitting device of the opaque display element which is driven by the thin film transistor. In addition, the step 504 may comprise: forming the organic light emitting device of the transparent display element on the substrate in the transparent region. In an exemplary embodiment, after forming the thin film transistor, organic light emitting devices the opaque display element and the transparent display element are formed simultaneously. According to the present invention, the transparent display element is formed in the transparent region of the transparent display device, so that independent driving of the AMOLED display element and the PMOLED display element can be realized.

In an exemplary embodiment, the method comprises: depositing an electrically conductive material on the substrate 310, and forming the anode 340 of the opaque display element 211 and the anode 342 of the transparent display element 221 by a first patterning process, wherein the anode 342 is transparent; forming a first interlayer dielectric layer which covers the anodes 340, 342, and forming a patterned first interlayer dielectric layer by a second patterning process; depositing an organic light emitting material to form the organic light emitting layer 350 of the opaque display element 211 and the organic light emitting layer 352 of the transparent display element 221; and depositing a transparent electrically conductive material, and forming the cathode 360 of the opaque display element 211 and the cathode 362 of the transparent display element 221 by a third patterning process, wherein the cathodes 360, 362 are disconnected from each other. According to the embodiment, the organic light emitting device of the transparent display element 221 is formed during forming the organic light emitting device of the opaque display element 211, so that the fabricating process of the transparent display element 221 is compatible with that of the opaque display element 211, and alternations to the fabricating process are reduced. In addition, the opaque display element 211 and the transparent display element 221 have isolated cathodes 360, 362, thus the opaque display element 211 and the transparent display element 221 can be independently controlled.

As the person with ordinary skill in the art knows, the patterning process generally comprises, but not limited to, steps of cleaning substrate, forming film, applying photoresist, exposing, developing, etching, and peeling off photoresist.

In an exemplary embodiment, the organic light emitting layer 350, 352 can be formed by evaporation with a fine metal mask (FMM). The FMM has a minimum positioning error of about ±1 micrometer. The cathodes 360, 362 can be formed by evaporation with an open mask. The open mask has a positioning error of about ±10 micrometer, which is sufficient for a display structure of a low resolution like the transparent display device.

In an exemplary embodiment, the first interlayer dielectric layer can at least comprise a pixel defining layer 332, which is arranged at a peripheral region of the opaque region 210 and the transparent region 220 for defining a pixel aperture of the organic light emitting device for the opaque display element 211 and the transparent display element 221. In an exemplary embodiment, the pixel defining layer 332 has a via hole in the peripheral region of the transparent region 220. According to the embodiment, the pixel defining layer 332 of the opaque display element 211 and that of the transparent display element 221 can be formed simultaneously, thus simplifying the fabricating process.

In an exemplary embodiment, the method may further comprise: before forming the anodes 340, 342, forming a thin film transistor of the opaque display element 211 in the opaque region 210; and depositing the passivation layer 326 on the substrate 310 which covers the thin film transistor, wherein the passivation layer 326 is provided with a via hole which exposes the source 324 or the drain 325 of the thin film transistor, and the anode 340 of the opaque display element 211 is electrically connected with the source 324 or the drain 325 through the via hole in the passivation layer 326. Thereby, the opaque display element 211 like an AMOLED display element is formed in the opaque region 210.

In an exemplary embodiment, the method may further comprise: after depositing the passivation layer 326, performing a fourth patterning process on the passivation layer 326, so that after patterning the passivation layer 326 has a larger thickness in the opaque region 210 than in the transparent region 220. According to the embodiment, the passivation layer 326 has a height difference between the opaque region 210 and the transparent region 220, so that the subsequently formed cathodes 360, 362 of the opaque display element 211 and the transparent display element 221 can be isolated from each other.

In an exemplary embodiment, the method may further comprise: before forming the cathode 360 of the opaque display element 211, forming the spacer 334 on the patterned first interlayer dielectric layer in the opaque region 210. The spacer 334 is arranged below the cathode 360 of the opaque display element 211, and no spacer is arranged below the cathode 362 of the transparent display element 221, so that the height difference between the opaque region 210 and the transparent region 220 can be increased, which facilitates forming the isolated cathodes 360, 362.

In an exemplary embodiment, as shown in FIGS. 4A-4E, forming the anode 340 of the opaque display element 211 and the anode 342 of the transparent display element 221 may comprise: depositing the stack comprising the first transparent electrode layer 402, the reflective electrode layer 404 and the second transparent electrode layer 406; and performing a fifth patterning process on the stack, forming the stack comprising the first transparent electrode layer 402, the reflective electrode layer 404 and the second transparent electrode layer 406 in the opaque region 210 as the anode 340 of the opaque display element 211, and only retaining the first transparent electrode layer 402 in the transparent region 220 as the anode 342 of the transparent display element 221. The anode 340 of the opaque display element 211 and the anode 342 of the transparent display element 221 are disconnected from each other. According to the embodiment, when the opaque display element 211 operates independently, it emits from a single side (top emitting) and realizes the function of transparent display; while when the transparent display element 221 operates independently, it realizes the function of double side display.

In an exemplary embodiment, forming the anode 340 of the opaque display element 211 and the anode 342 of the transparent display element 221 may comprise: after depositing the stack comprising the first transparent electrode layer 402, the reflective electrode layer 404 and the second transparent electrode layer 406, forming a photoresist layer on the stack by using a half tone mask 412, 422, wherein the photoresist layer 412 has a larger thickness in the opaque region 210 than that of the photoresist layer 422 in the transparent region 220 (FIG. 4A); removing the stack between the opaque region 210 and the transparent region 220 by etching (FIG. 4B); thinning the photoresist layer 412 in the opaque region 210 and removing the photoresist layer 422 in the transparent region 220 (FIG. 4C) by exposure; removing the reflective electrode layer 404 and the second transparent electrode layer 406 in the transparent region 220 by etching (FIG. 4D); and removing the thinned photoresist layer 412' in the opaque region 210 by exposure (FIG. 4E). According to the embodiment, the anode 342 of the transparent display element 221 can be formed during forming the anode 340 of the opaque display element 211, thus simplifying the fabricating process of the anode 342.

In an exemplary embodiment, the first transparent electrode layer 402 can be made from polycrystalline transparent electrically conductive oxides, the reflective electrode layer 404 can be made from a reflective metal, and the second transparent electrode layer 406 can be made from amorphous transparent electrically conductive oxides. For example, the transparent electrically conductive oxides can be ITO (indium tin oxide), IZO (indium zinc oxide), IGZO (indium gallium zinc oxide), InGaSnO (indium gallium tin oxide), or the like. For example, the reflective metal can be Ag or Mg/Ag alloy. For example, the reflective electrode layer 404 can be an Ag layer, and have a thickness of about 1000 Å. For example, the first transparent electrode layer 402 and the second transparent electrode layer 406 can be an ITO layer, and have a thickness of about 80 Å. According to the embodiment, by utilizing different tolerance against an etching solution for transparent electrically conductive oxides in different states, the anode 342 of the transparent display element 221 can be formed during forming the anode 340 of the opaque display element 211, thus simplifying the fabricating process of the anode 342. For example, in this embodiment, the first transparent electrode layer 402 can be made from polycrystalline ITO, and the second transparent electrode layer 406 can be made from amorphous ITO. During removing the second transparent electrode layer 406 in the transparent region 220 by etching (FIG. 4D), polycrystalline ITO is not sensitive to the etching solution for etching amorphous ITO, so that the first transparent electrode layer 402 which is made from polycrystalline ITO will not be etched.

In an exemplary embodiment, as shown in FIG. 3B, the method may further comprise: forming the electrically connecting element 241 for electrically connecting the cathodes 362 of any two neighboring the transparent display elements 221. Since the cathodes 362 of any two neighboring the transparent display elements 221 are connected via the electrically connecting element 241, it is only required for the negative pole of the driving source to be connected to one of the cathodes 362, instead of each cathode, thus simplifying the driver circuit.

In an exemplary embodiment, as shown in FIG. 3B, the method may further comprise: after depositing the electrically conductive material on the substrate 310, forming the anode 342 of the transparent display element 221 and the electrically connecting element 241 simultaneously by the first patterning process, wherein the anode 342 of the transparent display element 221 and the electrically connecting element 241 are disconnected from each other, and the electrically connecting element 241 is electrically connected with the cathode 362 of the transparent display element 221 through the via hole in the pixel defining layer 332. The electrically connecting element 241 and the anode 362 of the transparent display element 221 are formed simultaneously from a same material layer, can simplify fabricating process.

In an exemplary embodiment, the present invention further provides a display apparatus. The display apparatus comprises the OLED pixel unit 200 as described above, or comprises the transparent display device 20 as described above. The display apparatus has identical or similar technical effects with the OLED pixel unit 200 and/or the transparent display device 20, which are not described in details for simplicity. The display apparatus can be any product or component with a display function, such as a mobile phone, a tablet, a TV set, a monitor, a notebook computer, a digital photo frame, a navigator, an electronic paper.

Apparently, the skilled person in the art can make various modifications and variations to the present invention without departing from the spirit and the scope of the present invention. In this way, provided that these modifications and variations of the present invention belong to the scopes of the claims of the present invention and the equivalent technologies thereof, the present invention also intends to encompass these modifications and variations.

What is claimed is:

1. An OLED pixel unit, comprising an opaque region and a transparent region which are arranged side by side, the opaque region comprises an opaque display element, wherein the transparent region comprises at least one transparent display element,
    wherein a cathode of the opaque display element and a cathode of the transparent display element are made from a same material layer simultaneously and are disconnected from each other, and
    wherein at least one insulating layer in a multilayer structure below the cathode of the opaque display element and the cathode of the transparent display element shows a height difference between the opaque region and the transparent region.

2. The OLED pixel unit of claim 1, wherein the multilayer structure comprises a passivation layer which is arranged below an anode of the opaque display element and an anode of the transparent display element, and the passivation layer has a larger thickness in the opaque region than that in the transparent region.

3. The OLED pixel unit of claim 1, wherein a spacer is arranged below the cathode of the opaque display element.

4. The OLED pixel unit of claim 1, wherein the opaque display element is an AMOLED display element, and the transparent display element is a PMOLED display element.

5. The OLED pixel unit of claim 1, wherein the anode of the opaque display element and the anode of the transparent display element are arranged in a same layer.

6. The OLED pixel unit of claim 5, wherein the anode of the opaque display element is a stack of a first transparent electrode layer, a reflective electrode layer and a second transparent electrode layer, and the anode of the transparent display element is formed from the first transparent electrode layer.

7. The OLED pixel unit of claim 6, wherein the first transparent electrode layer is made from polycrystalline ITO, the reflective electrode layer is made from Ag, and the second transparent electrode layer is made from amorphous ITO.

8. A transparent display device, comprise a plurality of OLED pixel units of claim 1 arranged in a matrix, each OLED pixel unit comprises an opaque region and a transparent region which are arranged side by side, the opaque region comprises an opaque display element, wherein the transparent region comprises at least one transparent display element.

9. The transparent display device of claim 8, wherein the opaque display element is an AMOLED display element, the transparent display element is a PMOLED display element, and the plurality of OLED pixel units are defined by gate lines and data lines.

10. The transparent display device of claim 8, wherein cathodes of any two neighboring the transparent display elements are electrically connected with each other by an electrically connecting element.

11. The transparent display device of claim 10, wherein the electrically connecting element and the anode of the transparent display element are made from a same material layer simultaneously and are disconnected from each other.

12. A method for fabricating a transparent display device, wherein the transparent display device comprises a plurality of OLED pixel units arranged in a matrix, each OLED pixel unit comprises an opaque region and a transparent region which are arranged side by side, the opaque region comprises an opaque display element, and the transparent region comprises at least one transparent display element, wherein the method comprises: forming an opaque display element on a substrate of the opaque region, and forming at least one transparent display element on a substrate of the transparent region,
    wherein forming the opaque display element and the transparent display element comprises:
    depositing an electrically conductive material on the substrate, forming the anode of the opaque display element and the anode of the transparent display element by a first patterning process, wherein the anode of the transparent display element is transparent;

forming a first interlayer dielectric layer covering the anode of the opaque display element and the anode of the transparent display element, and forming a patterned first interlayer dielectric layer by a second patterning process;

depositing an organic light emitting material to form an organic light emitting layer of the opaque display element and an organic light emitting layer of the transparent display element; and depositing a transparent electrically conductive material, and forming a cathode of the opaque display element and a cathode of the transparent display element by a third patterning process, wherein the cathode of the opaque display element is disconnected from the cathode of the transparent display element.

13. The method of claim 12, wherein the first interlayer dielectric layer at least comprises a pixel defining layer, wherein the pixel defining layer is arranged at a peripheral region of the opaque region and the transparent region for defining a pixel aperture, and the pixel defining layer is provided with a via hole at the peripheral region of the transparent region.

14. The method of claim 12, wherein the method further comprises:

before forming the cathode of the opaque display element, forming a spacer on the patterned first interlayer dielectric layer in the opaque region.

15. A display apparatus, comprising the OLED pixel unit of claim 1.

16. The method of claim 12, wherein the opaque display element is an AMOLED display element, the transparent display element is a PMOLED display element, and the method further comprises:

before forming the anode of the opaque display element and the anode of the transparent display element, forming a thin film transistor of the opaque display element in the opaque region; and depositing a passivation layer on the substrate which covers the thin film transistor, wherein a via hole is formed in the passivation layer through which the source or drain of the thin film transistor is exposed, and the anode of the opaque display element is electrically connected with the source or drain of the thin film transistor through the via hole in the passivation layer.

17. The method of claim 16, wherein the method further comprises:

after depositing the passivation layer, performing a fourth patterning process on the passivation layers, so that after patterning the passivation layer has a larger thickness in the opaque region than that in the transparent region.

* * * * *